United States Patent
Tago et al.

(10) Patent No.: US 9,922,918 B2
(45) Date of Patent: Mar. 20, 2018

(54) SUBSTRATE FOR STACKED MODULE, STACKED MODULE, AND METHOD FOR MANUFACTURING STACKED MODULE

(71) Applicant: Murata Manufacturing Co., Ltd., Nagaokakyo-shi, Kyoto-fu (JP)

(72) Inventors: Shigeru Tago, Nagaokakyo (JP); Hirofumi Shinagawa, Nagaokakyo (JP); Yuki Wakabayashi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/450,093

(22) Filed: Mar. 6, 2017

(65) Prior Publication Data

US 2017/0179014 A1   Jun. 22, 2017

Related U.S. Application Data

(63) Continuation of application No. PCT/JP2015/075675, filed on Sep. 10, 2015.

(30) Foreign Application Priority Data

Sep. 26, 2014  (JP) ................................. 2014-196768
Mar. 16, 2015  (JP) ................................. 2015-051592

(51) Int. Cl.
*H01L 23/498*   (2006.01)
*H01L 23/00*   (2006.01)
(Continued)

(52) U.S. Cl.
CPC .... *H01L 23/49822* (2013.01); *H01L 21/4857* (2013.01); *H01L 21/4867* (2013.01);
(Continued)

(58) Field of Classification Search
CPC ........... H01L 23/49822; H01L 21/4867; H01L 23/49838; H01L 23/642; H01L 21/485; H01L 24/16; H01L 23/66

See application file for complete search history.

(56) References Cited

U.S. PATENT DOCUMENTS 7,894,200 B2 *  2/2011  Yoshino ............. H01L 23/5389
                                                           361/746
9,391,044 B2 *  7/2016  Shimizu ................. H05K 1/187
(Continued)

FOREIGN PATENT DOCUMENTS

JP      2000-003980 A     1/2000
JP      2003-086949 A     3/2003
(Continued)

OTHER PUBLICATIONS

Official Communication issued in International Patent Application No. PCT/JP2015/075675, dated Nov. 10, 2015.

*Primary Examiner* — William Coleman
(74) *Attorney, Agent, or Firm* — Keating & Bennett, LLP

(57) ABSTRACT

A substrate for a stacked module includes a stacked insulator in which a plurality of insulator layers mainly composed of a thermoplastic resin are stacked, a conductor pattern arranged along the plurality of insulator layers in the stacked insulator, an embedded component connected to the conductor pattern, a pad provided on a surface of the stacked insulator and configured to be ultrasonically bonded to a bump of a mounted component to be mounted on the surface of the stacked insulator, and an auxiliary conductor pattern between the pad and the embedded component and extending in a range that covers the pad and the embedded component as viewed in a stacking direction of the plurality of insulator layers.

17 Claims, 8 Drawing Sheets

(51) Int. Cl.
*H01L 23/64* (2006.01)
*H01L 21/48* (2006.01)
*H01L 23/66* (2006.01)
*H01L 21/60* (2006.01)

(52) U.S. Cl.
CPC ...... *H01L 23/49838* (2013.01); *H01L 23/642* (2013.01); *H01L 23/66* (2013.01); *H01L 24/16* (2013.01); *H01L 2021/60195* (2013.01); *H01L 2223/6644* (2013.01); *H01L 2223/6661* (2013.01); *H01L 2224/16227* (2013.01); *H01L 2224/16235* (2013.01)

(56) References Cited

U.S. PATENT DOCUMENTS

| | | |
|---|---|---|
| 2004/0212087 A1 | 10/2004 | Murayama et al. |
| 2011/0163457 A1* | 7/2011 | Mohan ................ H01L 21/4853 257/774 |
| 2013/0213699 A1 | 8/2013 | Chisaka |
| 2015/0084206 A1* | 3/2015 | Lin .................... H01L 23/5389 257/774 |
| 2015/0163917 A1 | 6/2015 | Yosui |

FOREIGN PATENT DOCUMENTS

| | | |
|---|---|---|
| JP | 2004-153084 A | 5/2004 |
| JP | 2004-327721 A | 11/2004 |
| JP | 2006-303202 A | 11/2006 |
| JP | 2012-195468 A | 10/2012 |
| JP | 2014-107514 A | 6/2014 |
| WO | 2012/046829 A1 | 4/2012 |
| WO | 2014/125852 A1 | 8/2014 |

\* cited by examiner

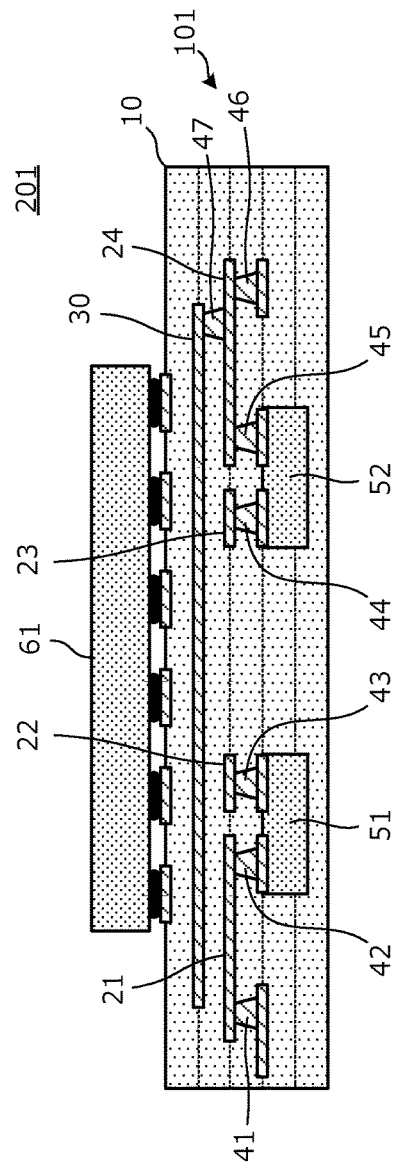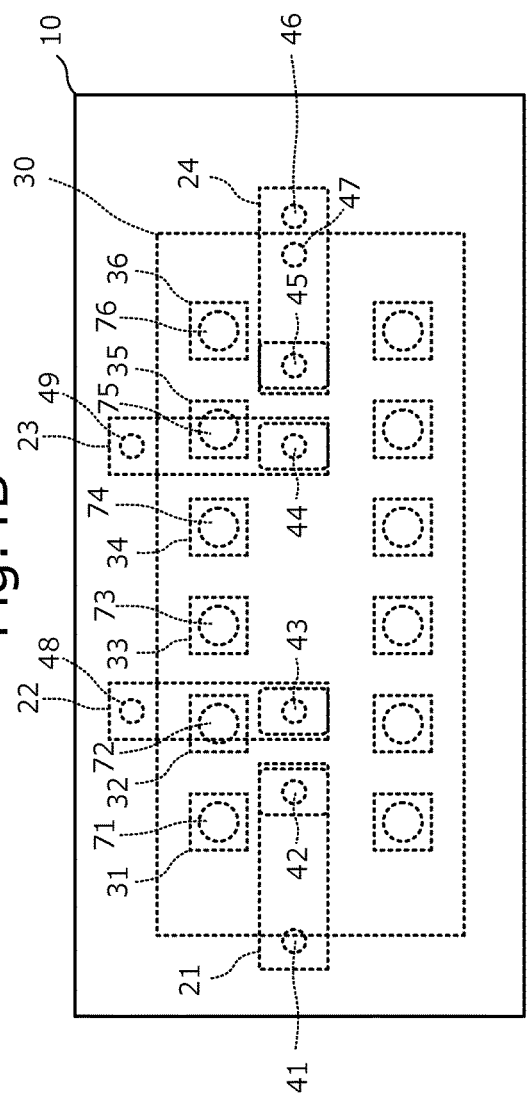

SUBSTRATE FOR STACKED MODULE, STACKED MODULE, AND METHOD FOR MANUFACTURING STACKED MODULE

CROSS REFERENCE TO RELATED APPLICATIONS

This application claims the benefit of priority to Japanese Patent Application No. 2014-196768 filed on Sep. 26, 2014 and Japanese Patent Application No. 2015-051592 filed on Mar. 16, 2015 and is a Continuation Application of PCT Application No. PCT/JP2015/075675 filed on Sep. 10, 2015. The entire contents of each application are hereby incorporated herein by reference.

BACKGROUND OF THE INVENTION

1. Field of the Invention

The present invention relates to a substrate for a stacked module, the substrate including a conductor pattern and a component in a stacked insulator, a stacked module including the substrate for a stacked module, and a method for manufacturing such a stacked module.

2. Description of the Related Art

A substrate described in, for example, International Publication No. 2012/046829, has been known as a conventional substrate for a stacked module, the conventional substrate including a conductor pattern and a component in a stacked insulator. The substrate for a stacked module disclosed in International Publication No. 2012/046829 includes a stacked insulator made of a thermoplastic resin and including a main surface, and an embedded component having a chip shape, a wiring conductor, and a via conductor arranged inside the stacked insulator; and further includes a frame-shaped electrode so as to encircle the embedded component when the stacked insulator is viewed from a direction perpendicular or substantially perpendicular to the main surface of the stacked insulator.

In the substrate for a stacked module disclosed in International Publication No. 2012/046829, the frame-shaped electrode, during thermal pressing, significantly reduces or prevents resin from unnecessarily flowing toward a cavity as an arrangement position of an embedded component to be provided in a stacked insulator.

The resin, however, cannot be significantly reduced or prevented from flowing toward the cavity of the stacked insulator in a stacking direction in which insulator bases are stacked. Such a resin flow in the stacking direction of the insulator bases may increase a risk that a connection failure is caused in a portion to which a component is connected in the stacked insulator.

In addition, if a surface of the stacked insulator deforms due to the resin flow, a bonding failure of a component (mounted component) to be mounted on the surface of the stacked insulator is liable to occur.

On the other hand, in a case in which an insulator layer of the stacked insulator is made of a resin sheet, since the rigidity of the stacked insulator is lower than the rigidity of ceramics, when the stacked insulator is ultrasonically bonded to the mounted component, a problem such as a difficulty of increasing the reliability of a portion in which the stacked insulator and the mounted component are bonded to each other may be caused.

SUMMARY OF THE INVENTION

Preferred embodiments of the present invention enhance stability of a portion to which an embedded component is bonded by thermocompression bonding of an insulator layer mainly composed of a thermoplastic resin. In addition, preferred embodiments of the present invention also enhance stability of a portion to which a mounted component to be mounted on a surface of a stacked insulator is bonded.

A substrate for a stacked module according to a preferred embodiment of the present invention includes a stacked insulator in which a plurality of insulator layers mainly composed of a thermoplastic resin are stacked; a conductor pattern arranged along the plurality of insulator layers in the stacked insulator; an embedded component connected to the conductor pattern; a pad provided on a surface of the stacked insulator and configured to be ultrasonically bonded to a bump of a mounted component to be mounted on the surface of the stacked insulator; and an auxiliary conductor pattern between the pad and the embedded component and extending in a range that covers the pad and the embedded component as viewed in a stacking direction of the plurality of insulator layers.

According to the above configuration, a substrate for a stacked module with the high stability of a portion to which the embedded component is bonded is obtained.

The auxiliary conductor pattern may preferably be a portion of the conductor pattern. Accordingly, an insulator layer provided with the auxiliary conductor pattern as well as an insulator layer provided with the conductor pattern is able to be easily configured.

The auxiliary conductor pattern may preferably be a ground conductor pattern. Accordingly, the shielding effect of the embedded component, the shielding effect of the mounted component, and the isolation effect between the embedded component and the mounted component are obtained.

The embedded component may preferably include a plurality of embedded components, and the auxiliary conductor pattern may preferably continuously cover the plurality of embedded components as viewed in the stacking direction of the plurality of insulator layers. Accordingly, a flow of resin is significantly reduced or prevented over a wide range including positions in which a plurality of embedded components are located. In addition, the rigidity of the mounted component at a mounted position is increased over the wide range including the positions in which the plurality of embedded components are located.

The thickness of the auxiliary conductor pattern may preferably be larger than the thickness of the conductor pattern. Accordingly, the rigidity of the auxiliary conductor pattern is increased, and, when a stacked insulator is configured by thermal pressing, the deformation of the auxiliary conductor pattern is decreased, which prevents a failure such that a distance between the auxiliary conductor pattern and the conductor pattern adjacent to the auxiliary conductor pattern becomes shorter or a short-circuit occurs between the auxiliary conductor pattern and the conductor pattern adjacent to the auxiliary conductor pattern.

A substrate for a stacked module may further preferably include: an adjacent conductor pattern provided at a position closest to the auxiliary conductor pattern in the thickness direction, overlapped with the auxiliary conductor pattern in a plan view, and extending in an outer region of the auxiliary conductor pattern; and a flat conductor pattern provided in the outer region of the auxiliary conductor pattern in a plan view, and at least partially overlapped with the adjacent conductor pattern. Accordingly, when a stacked insulator is configured by thermal pressing, the deformation of the conductor pattern adjacent to the auxiliary conductor pattern is significantly reduced or prevented. Therefore, a failure such as a distance between the auxiliary conductor pattern and the conductor pattern adjacent to the auxiliary conductor pattern becoming shorter or a short circuit occurring between the auxiliary conductor pattern and the conductor pattern adjacent to the auxiliary conductor pattern is prevented.

The flat conductor pattern may preferably be a floating electrode pattern. Accordingly, even if the deformation of the flat conductor pattern when a stacked insulator is configured by thermal pressing is increased, and even if a distance between the conductor pattern and the flat conductor pattern is reduced, a substrate for a stacked module having significantly less variation in electrical characteristics is obtained.

A stacked module according to a preferred embodiment of the present invention includes: a stacked insulator in which a plurality of insulator layers mainly composed of a thermoplastic resin are stacked; a conductor pattern arranged along the plurality of insulator layers in the stacked insulator; an embedded component connected to the conductor pattern; a mounted component mounted on a surface of the stacked insulator and including a bump; a pad provided on the surface of the stacked insulator and configured to be ultrasonically bonded to the bump of the mounted component; and an auxiliary conductor pattern between the pad and the embedded component and extending in a range that covers the pad and the embedded component as viewed in a stacking direction of the plurality of insulator layers.

With the above configuration, since a flow of resin in the vicinity of a portion on which the embedded component is mounted is significantly reduced or prevented by the auxiliary conductor pattern, the stability of a portion to which the embedded component is bonded is high. In addition, since the rigidity right under the pad is increased, the stability of a portion to which the mounted component is bonded is high.

Another preferred embodiment of the present invention provides a method for manufacturing a stacked module including a stacked insulator in which a plurality of insulator layers mainly composed of a thermoplastic resin are stacked, a conductor pattern arranged along the plurality of insulator layers in the stacked insulator, an embedded component connected to the conductor pattern and including a terminal, and a mounted component mounted on a surface of the stacked insulator and including a bump, and the method includes: preparing an insulator base on which the conductor pattern is formed; arranging an auxiliary conductor pattern between a pad and the embedded component, the pad being formed on the surface of the stacked insulator and being configured to be ultrasonically bonded to the bump of the mounted component, and stacking and thermally pressing the embedded component and the insulator base; and ultrasonically bonding the bump of the mounted component to the pad.

The method described above is able to obtain a stacked module with the high stability of a portion to which the embedded component is bonded and the high stability of a portion to which the mounted component is bonded.

The method for manufacturing a stacked module may further preferably include: forming an embedded component housing portion in the insulator base; and arranging the embedded component in the embedded component housing portion.

With the method described above, it becomes easier to embed the embedded component in the stacked insulator, a flow of unnecessary resin is significantly reduced or prevented, and the stability of a portion to which the embedded component is bonded is able to be ensured more reliably.

The method for manufacturing a stacked module may further preferably include: forming an interlayer connection conductor forming hole in the insulator base; filling the interlayer connection conductor forming hole with a conductive paste; and bonding an interlayer connection conductor to the terminal of the embedded component by the conductive paste by thermally pressing the conductive paste filled in the interlayer connection conductor forming hole and the terminal of the embedded component while the conductive paste is contacted with the terminal of the embedded component.

With the method described above, even when the terminal of the embedded component is bonded to the interlayer connection conductor, the stability of a portion in which the terminal and the interlayer connection conductor are bonded to each other is able to be ensured.

According to various preferred embodiments of the present invention, a stacked module with the high stability of a portion to which an embedded component is bonded by thermocompression bonding of an insulator layer mainly composed of a thermoplastic resin is obtained. In addition, according to various preferred embodiments of the present invention, a stacked module with the high stability of a portion to which a mounted component to be mounted on a surface of the stacked insulator is bonded is obtained.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 4A is a cross-sectional view of the stacked module 201 according to the second preferred embodiment of the present invention and FIG. 4B is a bottom view of the stacked module 201.

DETAILED DESCRIPTION OF THE PREFERRED EMBODIMENTS

Figure 1:
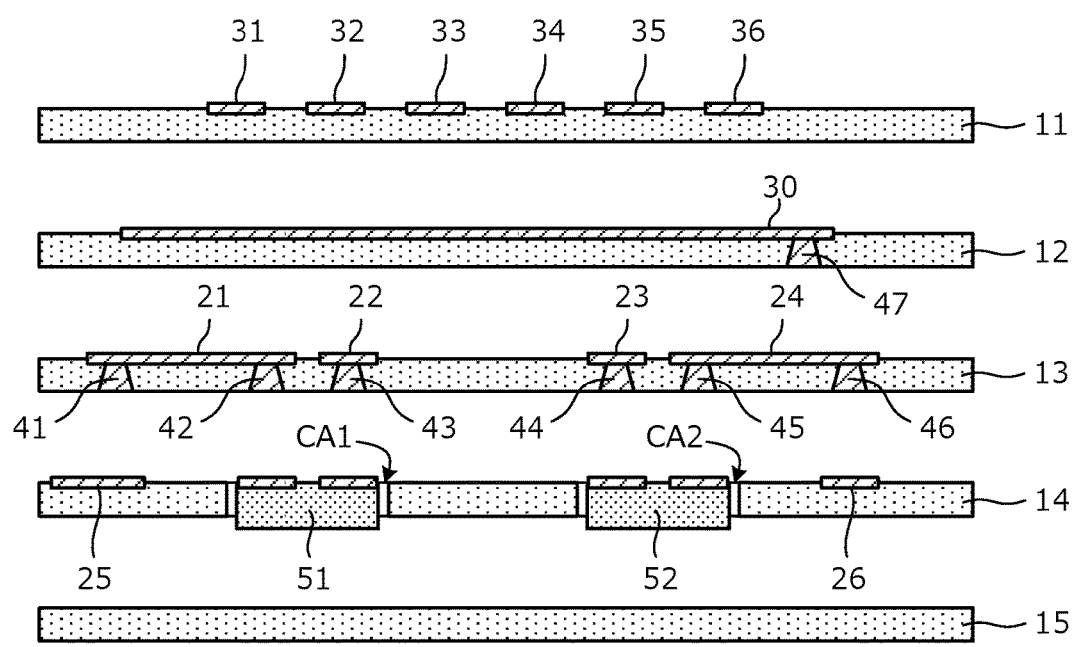
FIG. 1 is an exploded cross-sectional view of a substrate 101 for a stacked module according to a first preferred embodiment of the present invention.

Hereinafter, a plurality of preferred embodiments of the present invention will be described with reference to the attached drawings and several specific examples. In the drawings, components and elements assigned with the same reference numerals or symbols represent identical components and elements. In preferred embodiments after a first preferred embodiment, a description of matters common to the first preferred embodiment will be omitted, and different matters are mainly described. In particular, the same operational effects by the same configuration will not be described one by one for each preferred embodiment.

First Preferred Embodiment

Figure 2:
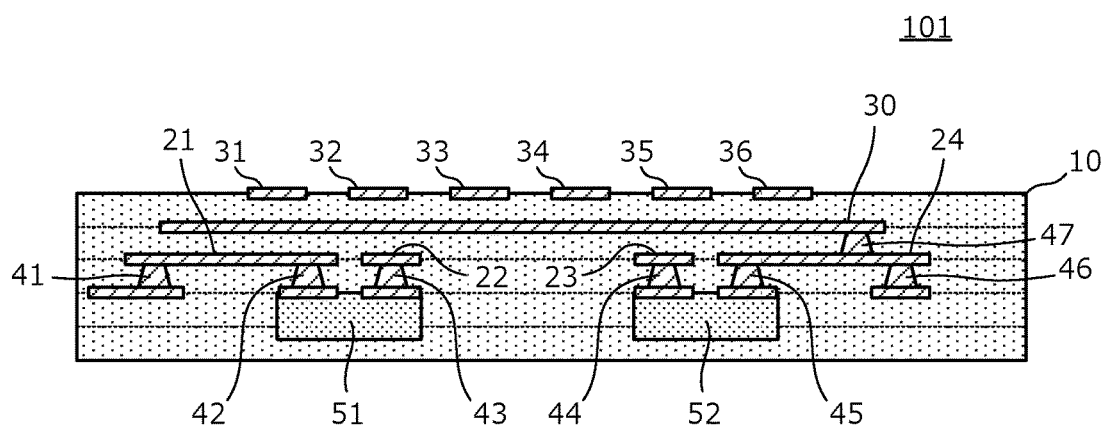
FIG. 2 is a cross-sectional view of the substrate 101 for a stacked module.

FIG. 1 is an exploded cross-sectional view of a substrate 101 for a stacked module according to a first preferred embodiment of the present invention. FIG. 2 is a cross-sectional view of the substrate 101 for a stacked module. The substrate 101 for a stacked module is provided with a stacked insulator 10 in which insulator layers 11, 12, 13, 14, and 15 are stacked on each other. The stacked insulator 10 is provided inside with a plurality of conductor patterns arranged along the insulator layers 11 to 15, and embedded components 51 and 52 each of which is connected to a predetermined conductor pattern among the plurality of conductor patterns. The embedded components 51 and 52 are chip capacitors that have a land terminal, for example.

The material of the insulator layers 11 to 15 preferably is a material mainly composed of a thermoplastic resin such as a liquid crystal polymer (LCP) and polyimide (PI), for example.

As shown in FIG. 1 and FIG. 2, the insulator layer 11 includes pads 31, 32, 33, 34, 35, and 36 to which a bump of a mounted component to be mounted on a surface of the stacked insulator 10 is ultrasonically bonded, on the upper surface of the insulator layer 11. In addition, the insulator layer 12 includes an auxiliary conductor pattern 30 on the upper surface of the insulator layer 12. The insulator layer 13 includes conductor patterns 21, 22, 23, and 24 on the upper surface of the insulator layer 13. In addition, the insulator layer 14 includes conductor patterns 25 and 26 on the upper surface of the insulator layer 14.

The insulator layer 12 includes an interlayer connection conductor 47. The insulator layer 13 includes interlayer connection conductors 41, 42, 43, 44, 45, and 46. The insulator layer 14 includes embedded component housing portions (cavity) CA1 and CA2.

The auxiliary conductor pattern 30 is provided between the pad to which the bump of a mounted component to be mounted on the surface of the stacked insulator 10 is ultrasonically bonded, and the embedded components 51 and 52. The auxiliary conductor pattern 30 extends along a range that covers the pads 31 to 36 and the embedded components 51 and 52 as viewed in the stacking direction of the insulator layers 11 to 15. In addition, the auxiliary conductor pattern 30 is electrically connected to the conductor pattern 24 through the interlayer connection conductor 47.

The substrate for a stacked module is manufactured, for example, by the following non-limiting procedures.

(1) An insulator base mainly composed of a thermoplastic resin and including a conductor pattern is prepared. For example, a one-sided copper-clad insulator sheet of which one side is clad with copper foil is used, and the copper foil of the sheet is patterned so as to form the predetermined conductor pattern.

(2) A through hole is opened at a predetermined position of the insulator base equivalent to each of the insulator layers 12 and 13 by processing such as laser processing, and the through hole is filled with a conductive paste. Such a conductive paste later defines and functions as the interlayer connection conductors 41 to 47.

(3) Embedded component housing portions CA1 and CA2 that house the embedded components 51 and 52 are formed in the insulator base equivalent to the insulator layer 14.

(4) The embedded components 51 and 52 are arranged in the embedded component housing portions CA1 and CA2. For example, the embedded components 51 and 52 each are placed at a predetermined position of the insulator base equivalent to the insulator layer 15 shown in FIG. 1, and the insulator base equivalent to the insulator layer 14 is stacked on the upper surface of the insulator base. Alternatively, for example, the embedded components 51 and 52 are temporarily bonded to the interlayer connection conductors 42, 43, 44, and 45 of the insulator base equivalent to the insulator layer 13 and are stacked on the insulator bases equivalent to the insulator layers 13, 14, and 15.

(5) The auxiliary conductor pattern 30 is arranged between the pads 31 to 36 and the embedded components 51 and 52, the pads being ultrasonically bonded to bumps 71, 72, 73, 74, 75, and 76 of a mounted component 61, is stacked on the insulator bases equivalent to the insulator layers 11 to 15, and is thermally pressed. Accordingly, the insulator layers 11 to 15 and the embedded components 51 and 52 are thermocompression bonded to each other by thermal pressing.

As stated above, the insulator layers 11 to 15 and the embedded components 51 and 52 are stacked on each other and thermally pressed, which configures a stacked insulator 10 shown in FIG. 2. Since, during the thermal pressing, a flow of resin in the vicinity of a portion on which the embedded components 51 and 52 are mounted is significantly reduced or prevented by the auxiliary conductor pattern 30, the stability of a portion to which each of the embedded components 51 and 52 is bonded is high. In particular, in a case in which the embedded component housing portions CA1 and CA2 are provided in order to arrange the embedded components 51 and 52, the resin is liable to flow toward the embedded component housing portions CA1 and CA2, but a flow of the resin is significantly reduced or prevented by the auxiliary conductor pattern 30. If no auxiliary conductor pattern 30 is provided, the embedded components 51 and 52 are likely to be inclined easily by the flow of the resin during the thermal pressing. If the embedded components 51 and 52 are inclined, a bonded surface on which the terminals of the embedded components 51 and 52 and the interlayer connection conductors 42, 43, 44, and 45 are bonded to each other becomes unstable. In addition, the conductive paste used as the interlayer connection conductors 42, 43, 44, and 45 to which the terminals of the embedded components 51 and 52 are bonded flows out, which may raise a risk of short circuit. By providing the auxiliary conductor pattern 30, the stability of a portion to which each of the embedded components 51 and 52 is bonded is ensured.

It is to be noted that the terminals of the embedded components 51 and 52 and the conductor pattern may be connected by solder without using the interlayer connection conductor.

Second Preferred Embodiment

Figure 3:
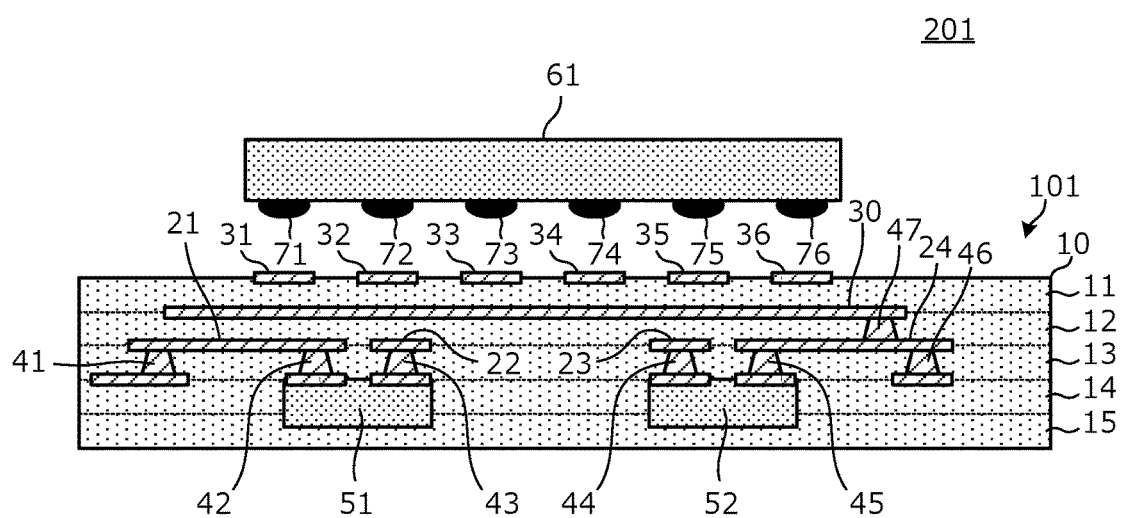
FIG. 3 is a cross-sectional view of a stacked insulator 10 and a mounted component 61 that define a stacked module 201 according to a second preferred embodiment of the present invention.
Figure 5:
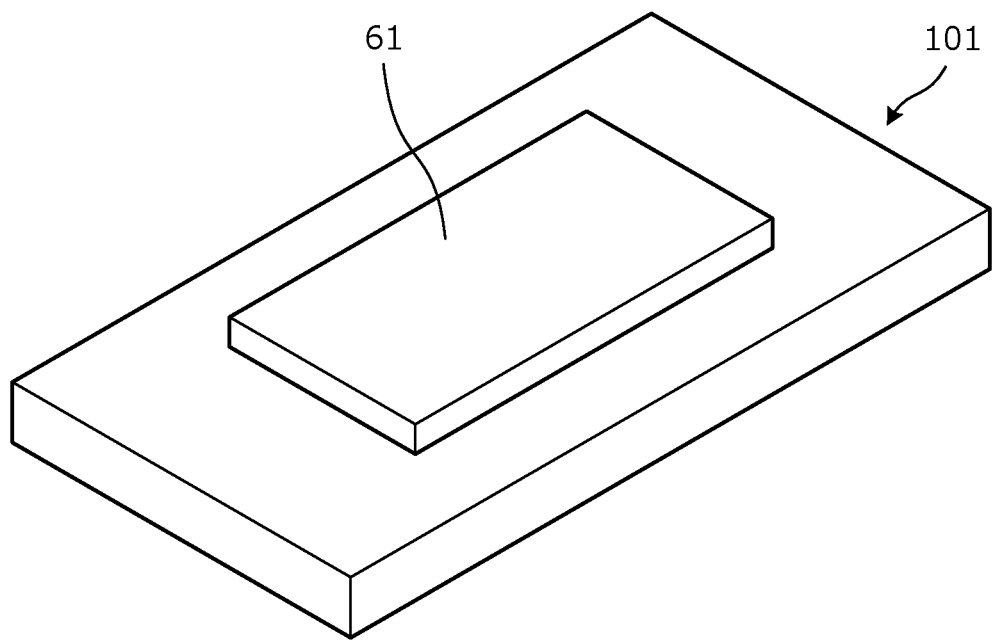
FIG. 5 is an external perspective view of the stacked module 201.

FIG. 3 is a cross-sectional view of a stacked insulator 10 and a mounted component 61 that configure a stacked module 201 according to a second preferred embodiment of the present invention. FIG. 4A is a cross-sectional view of the stacked module 201 according to the second preferred embodiment of the present invention and FIG. 4B is a bottom view of the stacked module 201. In addition, FIG. 5 is an external perspective view of the stacked module 201.

The stacked module 201 of the second preferred embodiment of the present invention includes the substrate for a stacked module 101 described in the first preferred embodiment of the present invention, and a mounted component 61.

Examples of the mounted component 61 include a Radio Frequency Integrated Circuit (RF-IC) or a processor that performs predetermined signal processing. As shown in FIG. 3, the mounted component 61 preferably is a chip component that is mainly provided with solder bumps 71 to 76 that are arranged in two rows on the bottom surface of the chip component. The mounted component 61 is ultrasonically bonded to the pads 31 to 36 provided on the top surface of the stacked insulator 10.

As shown in FIGS. 4A and 4B, the auxiliary conductor pattern 30 is located between the pads 31 to 36 of the top surface of the stacked insulator 10, and the embedded components and 52, and, as viewed the stacking direction of the insulator layers 11 to 15, extends along a range that covers the pads 31 to 36 and the embedded components 51 and 52. The auxiliary conductor pattern 30 increases the rigidity right under the pads 31 to 36, and, when the mounted component 61 is ultrasonically bonded to the pads 31 to 36, ultrasonic energy is efficiently applied to portions in which the pads 31 to 36 and the bumps 71 to 76 are bonded to each other. As a result, the high stability of a portion to which the mounted component 61 is bonded is obtained.

As shown in FIG. 4B, the interlayer connection conductors 41, 46, 48, and 49 other than the interlayer connection conductors bonded to the embedded components 51 and 52 among the interlayer connection conductors connected to the conductor patterns 21 to 24 are positioned so as not to be overlapped with the pads 31 to 36 in a plan view. Accordingly, the flatness of the mounting surface of the mounted component 61 is ensured. More preferably, the interlayer connection conductors 41, 46, 48, and 49 are positioned outside of the auxiliary conductor pattern 30 in a plan view. Thus, the flatness of the mounting surface of the mounted component 61 is ensured even more reliably. In addition, since the flatness of auxiliary conductor pattern 30 is able to be prevented from being spoiled or negatively impacted because the interlayer connection conductors 41, 46, 48, and 49 are overlapped with the auxiliary conductor pattern 30 in a plan view, when the mounted component 61 is ultrasonically bonded to the pads 31 to 36, ultrasonic energy is able to be efficiently applied to portions in which the pads 31 to 36 and the bumps 71 to 76 are bonded to each other.

In the second preferred embodiment of the present invention, the auxiliary conductor pattern 30 preferably is a ground conductor pattern. Accordingly, the embedded components and 52 and the mounted component 61 are shielded from external electric fields. Moreover, isolation between the embedded components 51 and 52 and the mounted component 61 is increased. For example, emission noise from the mounted component 61 is significantly reduced or prevented from being transmitted to a circuit configured in the stacked insulator.

It is to be noted that as long as a bonding material that fuses during ultrasonic bonding, such as a solder ball, is arranged on a side of the pads 31 to 36 of the stacked insulator 10, the mounted component 61 may be a chip component that has a land terminal.

The stacked module described above is not limited to a high-frequency component. For example, the mounted component 61 may be a CMOS image sensor and is also able to be applied to a camera module that is configured by the image sensor and the stacked insulator 10. In addition, a through hole is preferably provided in the stacked insulator 10 and is also able to be applied to a structure in which the image sensor is mounted on a back surface (a side away from a lens) of the stacked insulator 10. In such a case, a reduction in function as the camera module due to bonding while the image sensor is inclined is able to be significantly reduced or prevented.

Third Preferred Embodiment

A description of a third preferred embodiment of the present invention is given of a structure in which a distance between an auxiliary conductor pattern and a conductor pattern is ensured.

Figure 6:
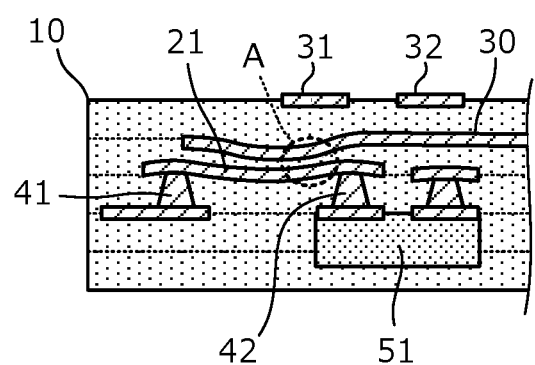
FIG. 6 is a partial cross-sectional view of a substrate 103CE for a stacked module as a comparative example of a substrate for a stacked module according to a third preferred embodiment of the present invention.

FIG. 6 is a partial cross-sectional view of a substrate 103CE for a stacked module in order to be compared and contrasted with a substrate for a stacked module according to the third preferred embodiment of the present invention. The basic configuration of the substrate 103CE for a stacked module is preferably the same as the substrate 101 for a stacked module mainly shown in FIG. 2 in the first preferred embodiment of the present invention.

A comparative example shown in FIG. 6 is an example in which, when the stacked insulator 10 is configured by thermal pressing, due to the deformation of the auxiliary conductor pattern 30, a distance between the auxiliary conductor pattern and the conductor pattern 21 adjacent to the auxiliary conductor pattern 30 becomes smaller in a portion as indicated by an ellipse A of a dashed line.

As shown in FIG. 6, the conductor pattern 21 is overlapped with the auxiliary conductor pattern 30 in a position closest to the auxiliary conductor pattern 30 in the thickness direction in a plan view, and also covers the outer region of the auxiliary conductor pattern 30.

When a plurality of insulator layers are stacked on each other and thermally pressed, the conductor pattern 21 may deform locally and may curve near the interlayer connection conductor 42 with a high rigidity. In such a case, the distance between the conductor pattern 21 and the auxiliary conductor pattern 30 becomes smaller near the interlayer connection conductor 42 (a portion as indicated by an ellipse A of a dashed line in FIG. 6). If the distance becomes too small, a risk of the occurrence of short circuit between the conductor pattern 21 and the auxiliary conductor pattern 30 may increase.

Figure 7A:
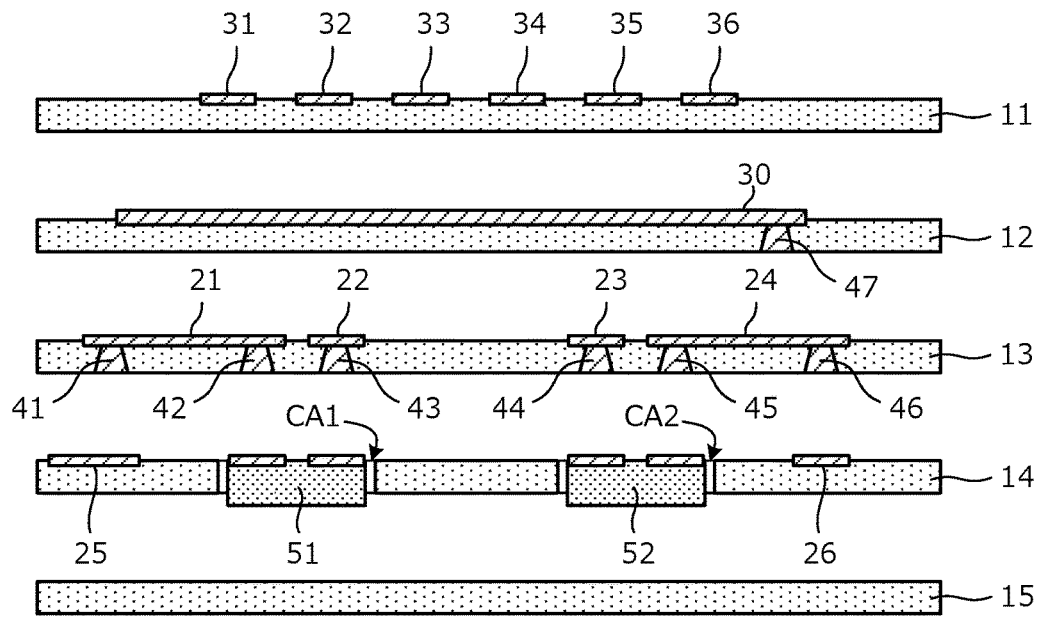
FIG. 7A is an exploded cross-sectional view of a substrate 103 for a stacked module according to the third preferred embodiment of the present invention.
Figure 7B:
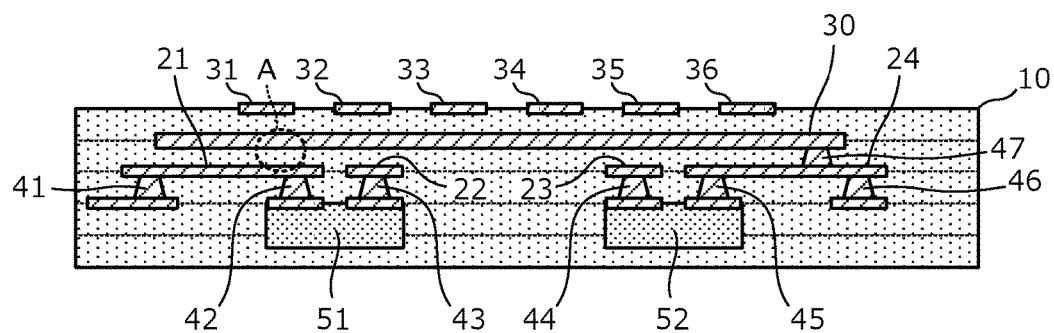
FIG. 7B is a cross-sectional view of the substrate 103 for a stacked module.

FIG. 7A is an exploded cross-sectional view of a substrate 103 for a stacked module according to the third preferred embodiment of the present invention. FIG. 7B is a cross-sectional view of the substrate 103 for a stacked module. The substrate 103 for a stacked module is provided with a stacked insulator 10 in which insulator layers 11, 12, 13, 14, and 15 are stacked on each other. The stacked insulator 10 is provided inside with a plurality of conductor patterns arranged along the insulator layers 11 to 15, and embedded components 51 and 52 each of which is connected to a predetermined conductor pattern among the plurality of conductor patterns. The mounted component 61 (see FIG. 3) is ultrasonically bonded to the pads 31 to 36 located on the top surface of the stacked insulator 10.

The thickness of the auxiliary conductor pattern 30 of the substrate 103 for a stacked module is larger than the thickness of the auxiliary conductor pattern 30 of the substrate 101 for a stacked module mainly shown in FIG. 1 and FIG. 2 in the first preferred embodiment of the present invention. For example, the auxiliary conductor pattern 30 is preferably about 1.5 or more times thicker than the conductor pattern 21. Therefore, the rigidity of the auxiliary conductor pattern 30 is high.

As is clear by comparing the comparative example of FIG. 6 and the third preferred embodiment of FIG. 7B, in the substrate 103 for a stacked module according to the third preferred embodiment of the present invention, since the rigidity of the auxiliary conductor pattern 30 is high, the conductor pattern 21 is unlikely to deform locally near the interlayer connection conductor 42 even if being thermally pressed. Thus, the distance between the conductor pattern 21 and the auxiliary conductor pattern 30 is unlikely to be small near the interlayer connection conductor 42 (a portion as indicated by A in FIG. 7B).

In addition, in a stacked module using the substrate 103 for a stacked module according to the third preferred embodiment of the present invention, the thick auxiliary conductor pattern 30 increases the rigidity right under the pads 31 to 36, and, when the mounted component 61 is ultrasonically bonded to the pads 31 to 36 via a bump, ultrasonic energy is more efficiently applied to portions in which the pads 31 to 36 and the bump are bonded to each other. As a result, the higher stability of a portion to which the mounted component 61 is bonded is obtained.

Fourth Preferred Embodiment

A description of a fourth preferred embodiment of the present invention is given of a structure in which a distance between an auxiliary conductor pattern and a conductor pattern is ensured, the structure being different from the third preferred embodiment of the present invention.

Figure 8A:
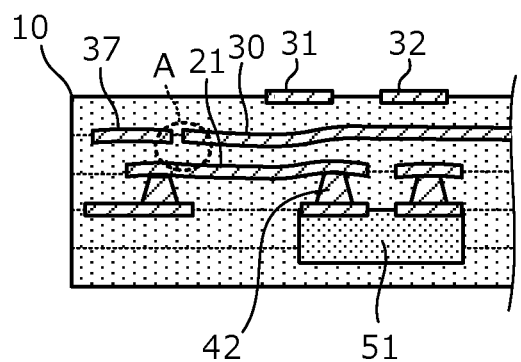
FIG. 8A is a partial cross-sectional view of a substrate 104 for a stacked module according to a fourth preferred embodiment of the present invention.
Figure 8B:
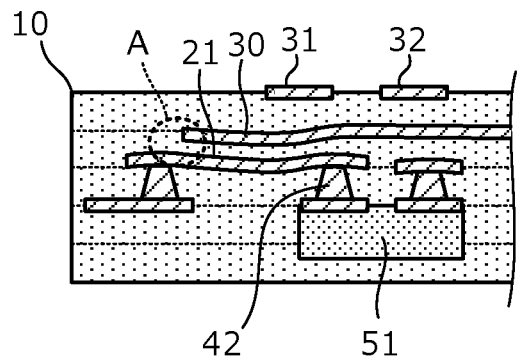
FIG. 8B is a partial cross-sectional view of a substrate 104CE for a stacked module as a comparative example.

FIG. 8A is a partial cross-sectional view of a substrate 104 for a stacked module according to the fourth preferred embodiment of the present invention. FIG. 8B is a partial cross-sectional view of a substrate 104CE for a stacked module in order to be compared and contrasted with a substrate for a stacked module according to the fourth preferred embodiment of the present invention. The basic configurations of the substrates 104 and 104CE for a stacked module are preferably the same as the substrate 101 for a stacked module mainly shown in FIG. 2 in the first preferred embodiment of the present invention. The conductor pattern 21 is overlapped with the auxiliary conductor pattern 30 in a plan view and covers the outer region of the auxiliary conductor pattern 30.

In the example shown in FIG. 8B, when the stacked insulator 10 is configured by thermal pressing, a difference in pressure is caused between a portion in which the auxiliary conductor pattern 30 is located and a portion in which the auxiliary conductor pattern 30 is not located, due to the deformation of the conductor pattern 21 adjacent to the auxiliary conductor pattern 30, the distance between the outer end (a portion as indicated by an ellipse A of a dashed line in FIG. 8B) of the auxiliary conductor pattern 30 and the conductor pattern 21 becomes smaller. If the distance becomes too small, a risk of the occurrence of short circuit between the conductor pattern 21 and the auxiliary conductor pattern 30 may increase.

In the substrate 104 for a stacked module of the fourth preferred embodiment of the present invention, the conductor pattern 21 is an example of an "adjacent conductor pattern". In the substrate 104 for a stacked module, a flat conductor pattern 37 is provided in the outer region of the auxiliary conductor pattern 30 in a plan view, and is at least partially overlapped with the conductor pattern 21. Accordingly, as shown in FIG. 8A, since the flat conductor pattern 37 faces the conductor pattern 21, which makes it hard to cause a difference in pressure between the portion in which the auxiliary conductor pattern 30 is located and the portion in which the auxiliary conductor pattern 30 is not located, when the stacked insulator 10 is configured by thermal pressing, the deformation of the conductor pattern 21 is significantly reduced or prevented. Therefore, a distance between the outer end (a portion as indicated by an ellipse A of a dashed line in FIG. 8A) of the auxiliary conductor pattern 30 and the conductor pattern 21 does not become extremely small. Thus, the short circuit between the auxiliary conductor pattern 30 and the conductor pattern 21 is prevented.

It is to be noted that the difference in pressure between the portion in which the auxiliary conductor pattern 30 is located and the portion in which the auxiliary conductor pattern 30 is not located is more likely to be caused as the thickness of the auxiliary conductor pattern 30 is larger. Thus, in the substrate 103 for a stacked module of the third preferred embodiment of the present invention, it may be particularly preferred that the flat conductor pattern of the fourth preferred embodiment of the present invention should be provided.

The flat conductor pattern 37 is preferably a floating electrode (an independent electrode that is not electrically connected to a conductor pattern that configures other circuits). Accordingly, even if the deformation of the flat conductor pattern 37 when a stacked insulator is configured by thermal pressing is increased, and even if the distance between the conductor pattern 21 and the flat conductor pattern 37 is reduced, a substrate for a stacked module having less variation in electrical characteristics is obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

Finally, the foregoing preferred embodiments are illustrative in all points and should not be construed to limit the present invention in any way. It is to be understood that variations and modifications of preferred embodiments of the present invention will be apparent to those skilled in the art without departing from the scope and spirit of the present invention. For example, configurations included in different preferred embodiments are able to be partially replaced and combined with each other. The scope of the present invention is defined not by the foregoing preferred embodiments but by the following claims. Further, the scope of the present invention is intended to include all modifications within the scopes of the claims and within the meanings and scopes of equivalents.

What is claimed is:

1. A substrate for a stacked module, comprising:
    a stacked insulator in which a plurality of insulator layers mainly composed of a thermoplastic resin are stacked;
    a conductor pattern arranged along the plurality of insulator layers in the stacked insulator;
    an embedded component connected to the conductor pattern;
    a pad provided on a surface of the stacked insulator and configured to be ultrasonically bonded to a bump of a mounted component to be mounted on the surface of the stacked insulator; and
    an auxiliary conductor pattern between the pad and the embedded component and extending in a range that covers the pad and the embedded component as viewed in a stacking direction of the plurality of insulator layers.

2. The substrate for a stacked module according to claim 1, wherein the auxiliary conductor pattern includes a portion of the conductor pattern.

3. The substrate for a stacked module according to claim 1, wherein the auxiliary conductor pattern includes a ground conductor pattern.

4. The substrate for a stacked module according to claim 1, wherein:
the embedded component includes a plurality of embedded components; and
the auxiliary conductor pattern continuously covers the plurality of embedded components as viewed in the stacking direction of the plurality of insulator layers.

5. The substrate for a stacked module according to claim 1, wherein a thickness of the auxiliary conductor pattern is larger than a thickness of the conductor pattern.

6. The substrate for a stacked module according to claim 1, further comprising:
an adjacent conductor pattern provided at a position closest to the auxiliary conductor pattern in a thickness direction, overlapped with the auxiliary conductor pattern in a plan view, and extending to an outer region of the auxiliary conductor pattern; and
a flat conductor pattern provided in the outer region of the auxiliary conductor pattern in a plan view, and at least partially overlapped with the adjacent conductor pattern.

7. The substrate for a stacked module according to claim 6, wherein the flat conductor pattern is a floating electrode pattern.

8. A stacked module comprising:
a stacked insulator in which a plurality of insulator layers mainly composed of a thermoplastic resin are stacked;
a conductor pattern arranged along the plurality of insulator layers in the stacked insulator;
an embedded component connected to the conductor pattern;
a mounted component mounted on a surface of the stacked insulator and including a bump;
a pad provided on the surface of the stacked insulator and configured to be ultrasonically bonded to the bump of the mounted component; and
an auxiliary conductor pattern between the pad and the embedded component and extending in a range that covers the pad and the embedded component as viewed in a stacking direction of the plurality of insulator layers.

9. The stacked module according to claim 8, wherein the auxiliary conductor pattern includes a portion of the conductor pattern.

10. The stacked module according to claim 8, wherein the auxiliary conductor pattern includes a ground conductor pattern.

11. The stacked module according to claim 8, wherein:
the embedded component includes a plurality of embedded components; and
the auxiliary conductor pattern continuously covers the plurality of embedded components as viewed in the stacking direction of the plurality of insulator layers.

12. The stacked module according to claim 8, wherein a thickness of the auxiliary conductor pattern is larger than a thickness of the conductor pattern.

13. The stacked module according to claim 8, further comprising:
an adjacent conductor pattern provided at a position closest to the auxiliary conductor pattern in a thickness direction, overlapped with the auxiliary conductor pattern in a plan view, and extending to an outer region of the auxiliary conductor pattern; and
a flat conductor pattern provided in the outer region of the auxiliary conductor pattern in a plan view, and at least partially overlapped with the adjacent conductor pattern.

14. The stacked module according to claim 13, wherein the flat conductor pattern is a floating electrode pattern.

15. A method for manufacturing a stacked module including a stacked insulator in which a plurality of insulator layers mainly composed of a thermoplastic resin are stacked, a conductor pattern arranged along the plurality of insulator layers in the stacked insulator, an embedded component connected to the conductor pattern and including a terminal, and a mounted component mounted on a surface of the stacked insulator and including a bump, the method comprising:
preparing an insulator base on which the conductor pattern is formed;
arranging an auxiliary conductor pattern between a pad and the embedded component, the pad being formed on the surface of the stacked insulator and being configured to be ultrasonically bonded to the bump of the mounted component, and stacking and thermally pressing the embedded component and the insulator base; and
ultrasonically bonding the bump of the mounted component to the pad.

16. The method for manufacturing a stacked module according to claim 15, further comprising:
forming an embedded component housing portion in the insulator base; and
arranging the embedded component in the embedded component housing portion.

17. The method for manufacturing a stacked module according to claim 15, further comprising:
forming an interlayer connection conductor forming hole in the insulator base;
filling the interlayer connection conductor forming hole with a conductive paste; and
bonding an interlayer connection conductor by the conductive paste to the terminal of the embedded component by thermally pressing the conductive paste filled in the interlayer connection conductor forming hole and the terminal of the embedded component while the conductive paste is contacted with the terminal of the embedded component.

* * * * *